United States Patent [19]
Ishida et al.

[11] Patent Number: 5,289,039
[45] Date of Patent: * Feb. 22, 1994

[54] RESIN ENCAPSULATED SEMICONDUCTOR DEVICE

[75] Inventors: Yoshihiro Ishida, Tokorozawa; Katsuji Komatsu; Seiichi Mimura, both of Kawagoe; Kikuo Takenouchi, Higashimurayama; Isao Yabe, Tokorozawa; Shingo Ichikawa, Sayama; Yoshihiro Shimada, Tokyo, all of Japan

[73] Assignee: Citizen Watch Co., Ltd., Tokyo, Japan

[*] Notice: The portion of the term of this patent subsequent to Aug. 3, 2010 has been disclaimed.

[21] Appl. No.: 912,065

[22] Filed: Jul. 7, 1992

Related U.S. Application Data

[63] Continuation of Ser. No. 652,326, Feb. 6, 1991, abandoned, which is a continuation-in-part of Ser. No. 263,669, Oct. 27, 1988, abandoned.

[30] Foreign Application Priority Data

Feb. 5, 1988 [JP] Japan ................... 63-25516
May 10, 1988 [JP] Japan ................. 63-111560
Jul. 28, 1988 [JP] Japan ................. 63-188854

[51] Int. Cl.⁵ .............................. H01L 23/48
[52] U.S. Cl. .................... 257/796; 257/675; 257/702; 257/706
[58] Field of Search ............ 357/72, 81; 257/675, 257/702, 706, 796

[56] References Cited

U.S. PATENT DOCUMENTS

| | | | |
|---|---|---|---|
| 3,783,345 | 1/1974 | Taylor et al. | 357/81 |
| 4,266,239 | 5/1981 | Miyagaki et al. | 357/72 |
| 4,541,005 | 9/1985 | Hunter et al. | 357/72 |
| 4,823,234 | 4/1989 | Konishi et al. | 357/72 |
| 4,878,108 | 10/1989 | Phelps et al. | 357/72 |

Primary Examiner—Edward Wojciechowicz
Attorney, Agent, or Firm—Townsend and Townsend Khourie and Crew

[57] ABSTRACT

A resin encapsulated pin grid array includes an IC chip mounted on a resin substrate having a plurality of contact pins on its lower surface and resin-encapsulated by injection molding. A metal heat radiating member is integrally formed on the upper surface of the encapsulating resin when the encapsulating resin is injection-molded.

5 Claims, 10 Drawing Sheets

FIG. 23A  BLANKING
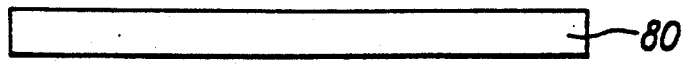
FIG. 23B  COINING
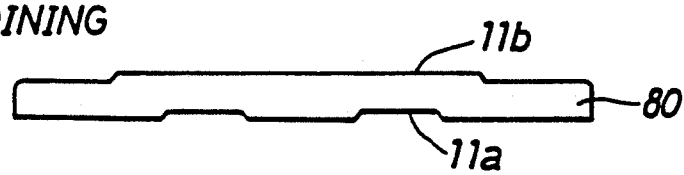
FIG. 23C  ANODIZED ALUMINUM
FIG. 23D  RESIST COATING
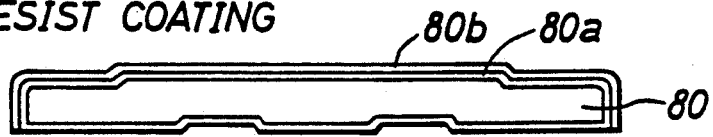
FIG. 23E  REMOVING OF ANODIZED ALUMINUM
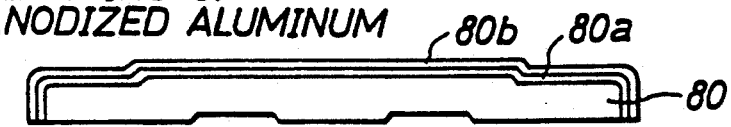
FIG. 23F  RESIST REMOVING
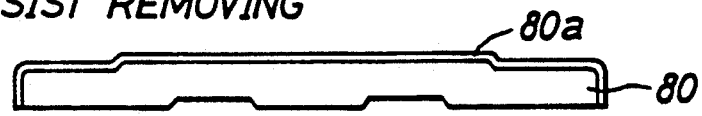
FIG. 23G  PUNCHING
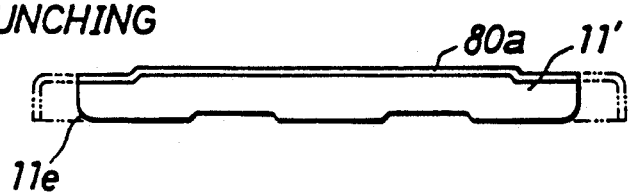

RESIN ENCAPSULATED SEMICONDUCTOR DEVICE

This is a continuation of application Ser. No. 07/652,326 filed Feb. 6, 1991, now abandoned which is a continuation in part of Ser. No. 263,669 filed Oct. 27, 1988, now abandoned.

BACKGROUND OF THE INVENTION

1. Field of the Invention

The present invention relates to a resin encapsulated semiconductor device and, more particularly, to a resin encapsulated pin grid array having a heat radiating structure and a method of manufacturing the same.

2. Description of the Prior Art

A pin grid array (to be referred to as a PGA hereinafter) will be described below as an example of a resin encapsulated semiconductor device.

Recently, in order to widen a range of applications of the PGA having an IC chip thereon, the IC chip is replaced with another to obtain another function, and a ceramic has been used for a substrate of the PGA for this purpose.

A ceramic substrate has a good insulating property and therefore has high reliability as a product. However, the ceramic substrate shrinks because wiring patterns are formed by printing and baking. Therefore, it is difficult to increase the number of wiring patterns or to achieve micropatterning. In addition, if the number of patterns is increased, the substrate size is increased accordingly. Furthermore, the ceramic substrate is expensive as parts.

As a substrate which can take place of the ceramic substrate, a PGA using a resin substrate (to be referred to as a "resin substrate PGA" hereinafter) which can achieve micropatterning and is inexpensive has been developed. The present applicant proposed, in Japanese Patent Application No. 61-87081, a packaging structure in which the upper and side surfaces of a resin substrate having a plurality of contact pins on its lower surface and an IC chip on its upper surface are completely covered with a molded resin.

That is, a PGA having the packaging structure (to be referred to as a resin encapsulated PGA hereinafter) proposed in the above patent application has a packaging structure in which the upper and side surfaces of a resin substrate 2 having a plurality of contact pins 20 on its lower surface and an IC chip 1 on its upper surface are completely covered with an injection-molded resin 6.

However, although the PGA using the above resin substrate 2 can be made more compact at lower cost by micropatterning than the PGA using the ceramic substrate, it has not been widely used yet because of its poor heat radiation property.

That is, an IC to be mounted on the PGA is an LSI having a large chip size. Therefore, an amount of heat generated by an operation current is large, and a temperature of the LSI is increased if the generated heat is not rapidly radiated outside the package. In this case, a read speed of the LSI is reduced, or in the worst case, the LSI is thermally destroyed.

The heat radiation properties of the ceramic substrate PGA and the resin substrate PGA will be compared below. First, a heat conductivity of ceramic as a package material is $4 \times 10^{-2}$ cal/cm.°C.sec, while those of a resin substrate and a molded resin which constitute the resin substrate PGA are $4.5 \times 10^{-4}$ cal/cm.°C.sec and $2 \times 10^{-3}$ cal/cm.°C.sec, respectively. That is, as for the heat conductivities of the packaging materials, that of the resin substrate PGA is 1/10 to 1/100 that of the ceramic substrate PGA. Therefore, heat generated in an IC chip of the ceramic substrate PGA is rapidly radiated through a ceramic substrate, a ceramic frame, and a ceramic cover. However, in the resin substrate PGA, a heat radiation amount is small because the resin material is used, and therefore a temperature of the IC chip is increased accordingly.

As described above, in order to widely spread the resin substrate PGA, its heat radiation property must be improved to a level closer to that of the ceramic substrate PGA. Therefore, conventional techniques will be described below in terms of improvements in the heat radiation property.

First, heat radiating paths of the PGA shown in FIG. 1 will be described. Heat generated from the IC chip 1 is radiated toward the lower surface through the resin substrate 2 and toward the upper surface through the injection-molded resin 6.

As for the path toward the upper surface, when a metal cap 5 is adhered on the upper surface of the encapsulating resin as indicated by an alternate long and dashed line in FIG. 1, the metal cap 5 serves as a heat radiating plate to significantly improve the heat radiation property. This phenomenon is not limited to the PGA. For example, a semiconductor which generates heat such as a power transistor having a conventional resin encapsulated structure has a metal heat radiation fin on the upper surface of the encapsulating resin to achieve the same effect.

As for the path toward the lower surface, no improvement has been made as a PGA as described above. However, heat radiating structures used in a resin substrate having a conventional semiconductor as shown in FIGS. 2 and 3 are known.

That is, in the structure shown in FIG. 2, a through hole 2a is formed in the resin substrate 2 at a position on which the IC chip 2 is mounted, and a metal vessel 50 formed by drawing is embedded in the through hole 2a. The IC chip 1 is placed in the vessel 50 to radiate heat generated from the IC chip 1 toward the lower surface through the vessel 50.

In the structure shown in FIG. 3, a metal plate 60 is adhered on the lower surface of the resin substrate 2 to cover the opening of the through hole 2a, and the IC chip 1 is placed on the metal plate 60. As a result, heat generated from the IC chip 1 is radiated toward the lower surface through the metal plate 60.

The above conventional techniques can be applied to the heat radiating structure of the resin substrate PGA. Of these conventional techniques, the heat radiating structure shown in FIG. 1 in which the metal cap 5 is adhered on or pushed in the encapsulating resin 6 has the following drawback.

That is, the heat radiation property toward the upper surface obtained by the metal cap 5 depends on an adhesion strength between the surface of the encapsulating resin 6 and the inner surface of the metal cap 5. However, if the metal cap 5 is adhered on or pushed in the encapsulating resin 6 as described above, the adhesion strength changes in accordance with surface precisions of the inner surface of the metal cap 5 and the surface of the encapsulating resin 6 or variations in amount of an adhesive and the like. As a result, a uniform heat radiation property cannot be obtained.

Furthermore, in the structure in which a heat radiating member such as the metal cap 5 or the heat radiation fin is mounted by adhering or pushing, a mounting height of the heat radiating member changes in accordance with a mounting state or a variation in amount of an adhesive. Therefore, a uniform outer shape as the PGA cannot be obtained. This poses a problem in terms of an outer appearance and prevents a high packing density in a limited space.

SUMMARY OF THE INVENTION

It is a first object of the present invention to provide a resin encapsulated PGA in which a heat radiation property toward an encapsulating resin is improved.

It·is a second object of the present invention to provide a resin encapsulated PGA with a stable outer shape.

It is a third object of the present invention to provide a resin encapsulated PGA in which a heat radiating member is integrally formed with an encapsulating resin.

It is a fourth object of the present invention to provide a resin encapsulated PGA having good heat radiation property and outer appearance quality.

BRIEF DESCRIPTION OF THE DRAWINGS

FIGS. 23A to 23G are sectional views for explaining manufacturing steps of the heat radiating plate used in the present invention.

DETAILED DESCRIPTION OF THE PREFERRED EMBODIMENTS

Embodiments of the present invention will be described below with reference to the accompanying drawings.

Figure 1:
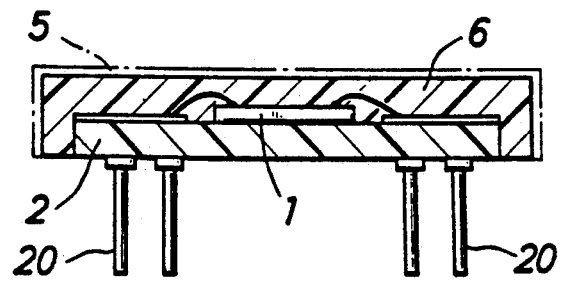
FIG. 1 is a sectional view showing a conventional resin encapsulated PGA.
Figure 2:
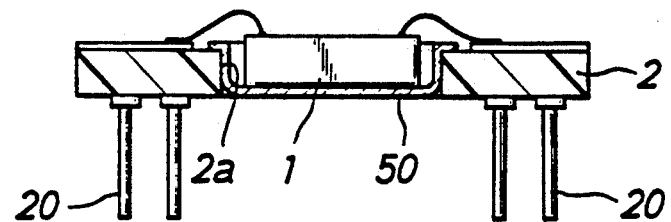
FIG. 2 is a sectional view showing a heat radiating structure of the conventional resin encapsulated PGA.
Figure 3:
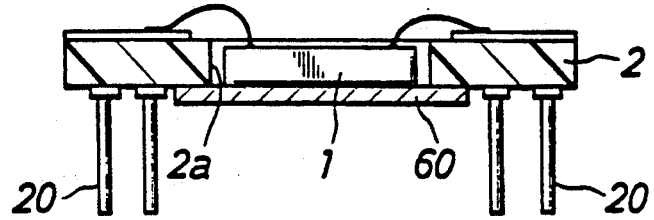
FIG. 3 is a sectional view showing another heat radiating structure of the conventional resin encapsulated PGA.
Figure 4:
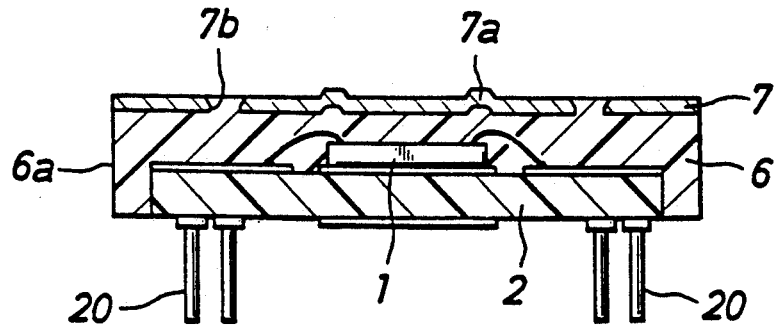
FIG. 4 is a sectional view showing an embodiment of a resin encapsulated PGA according to the present invention.

FIG. 4 is a sectional view showing a resin encapsulated pin grid array completed in accordance with the present invention. This structure is obtained by integrally molding a heat radiating plate 7 on the upper surface of an injection-molded resin 6 of a resin encapsulated PGA proposed in Japanese Patent Application No. 61-87081. In this structure, heat generated from an IC chip 1 placed on a resin substrate 2 is radiated from the heat radiating plate 7 through the injection-molded resin 6. In order to improve a heat radiation property, the injection-molded resin 6 must be integrally molded with the heat radiating plate 7 not through an adhesive layer. In addition, in order to maintain a humidity resistance of the package, an adhesion strength between the heat radiating plate 7 and the injection-molded resin 6 must be enhanced. For this purpose, notch-like countersinks 7b are formed in the heat radiating plate 7 shown in FIG. 4. During injection molding, the injection-molded resin 6 is filled in these countersinks 7b to firmly fix the heat radiating plate 7 to the injection-molded resin 6.

A relationship between the heat radiating plate 7 and metal molds for integrally molding the heat radiating plate 7 and the injection-molded resin 6 will be described.

Figure 5:
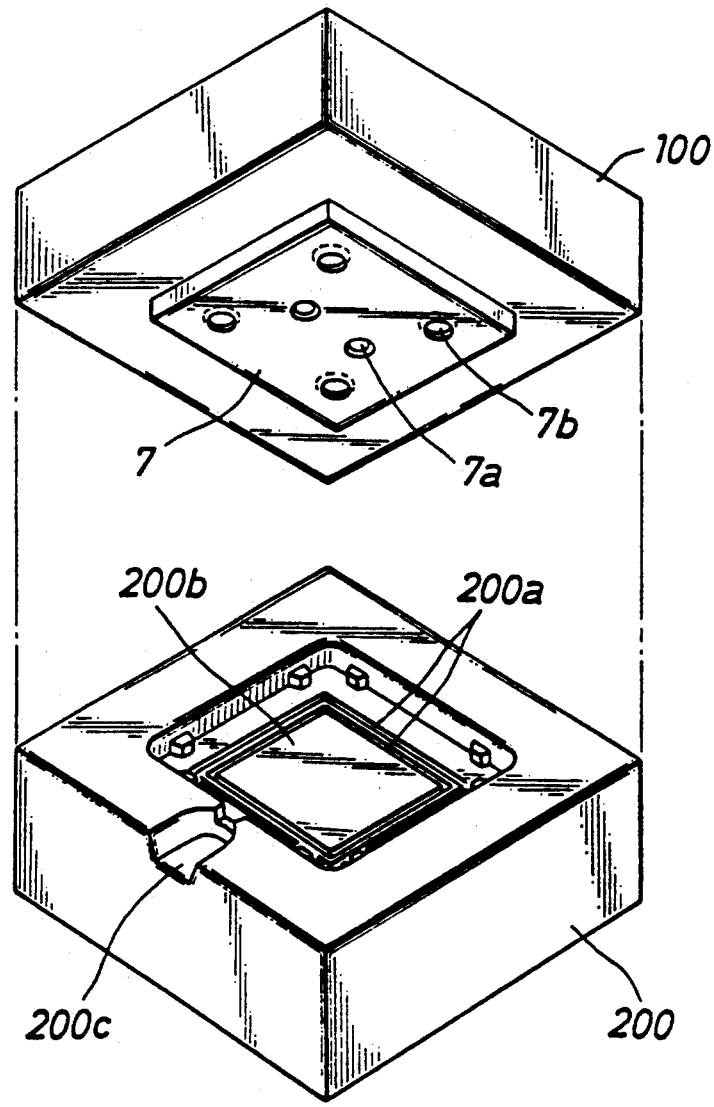
FIG. 5 is a perspective view showing a mold for molding the resin encapsulated PGA according to the present invention.

FIG. 5 shows a structure of an upper half 100 and a lower half 200 of the mold according to the present invention. A heat radiating plate 70 is positioned and chucked to the upper half 100.

A relief hole 200a for contact pins 20, a recess portion 200b on which the resin substrate 2 is placed, and a gate 200c are formed in the lower half 200.

Figure 6:
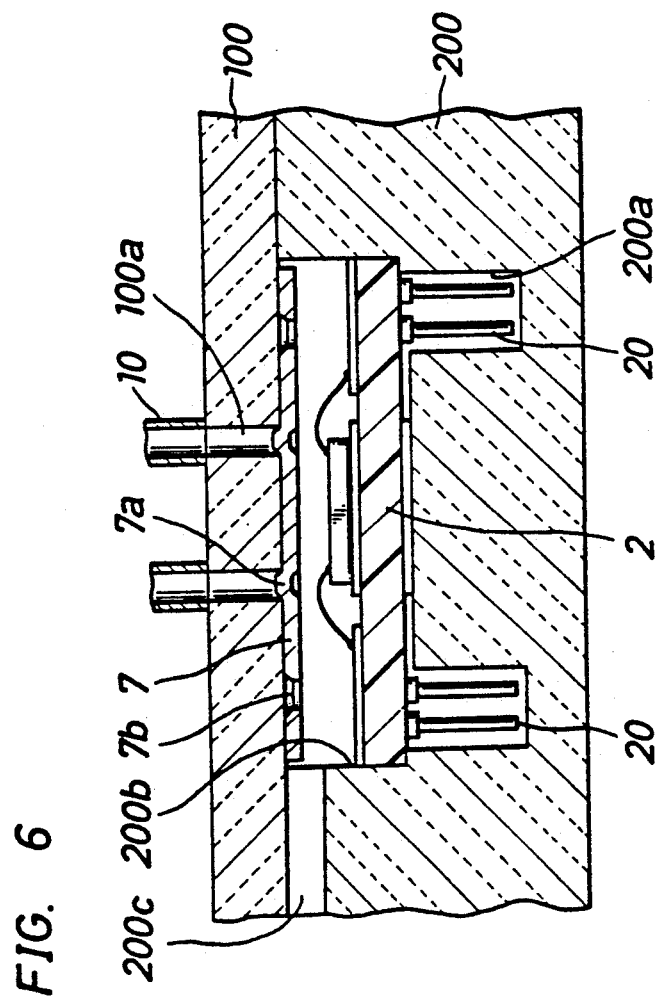
FIG. 6 is a sectional view showing the mold for the resin encapsulated PGA according to the present invention in an injection molding state.

FIG. 6 is a sectional view showing the mold. In FIG. 6, the heat radiating plate 7 is chucked and fixed to the upper half 100 by a suction force of tubes 10 inserted through vacuum holes 100a formed in the upper half 100. The heat radiating plate 7 is positioned when embosses 7a formed on the upper surface are fitted in the vacuum holes 100a of the upper half 100.

The resin substrate 2 is placed on the recess portion 200b of the lower half 200 and the injection-molded resin 6 is supplied to the recess portion 200b from the gate 200c, thereby completing the resin encapsulated PGA shown in FIG. 4.

Figure 7:
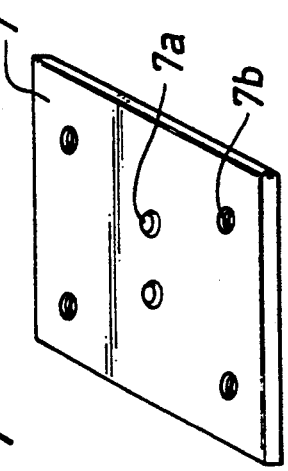

FIG. 7 is a perspective view showing the heat radiating plate 7. Examples of a material of the heat radiating plate 7 are metals having a good heat conductivity such as aluminum (Al), copper (Cu), and brass (Bs). In order to improve an adhesion strength with respect to the injection-molded resin 6, a surface treatment such as surface roughening, plating, a chemical treatment, or the like is performed to the heat radiating plate 7.

In order to improve the heat radiation property of the heat radiating plate 7, it is important not only to select a material having a good heat conductivity but also to select a proper shape of the heat radiating plate.

Figure 8:
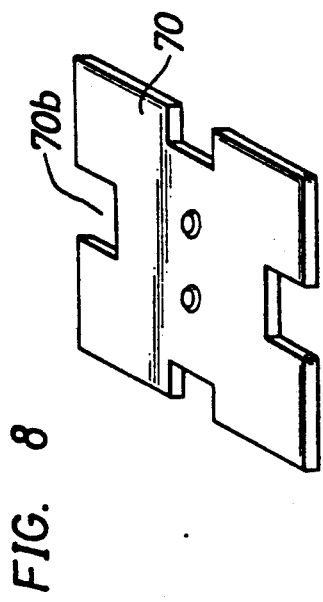
FIGS. 7 to 10 are perspective views showing various radiating plates used in the resin encapsulated PGA according to the present invention.
Figure 9:
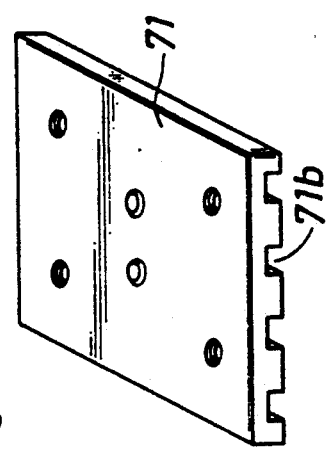
Figure 10:
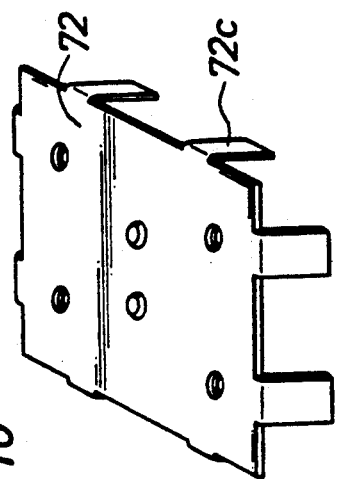

FIGS. 8 to 10 are perspective views showing other embodiments of the heat radiating plate 7.

A heat radiating plate 70 shown in FIG. 8 has notch portions 70b instead of the countersinks 7b. In a heat radiating plate 71 shown in FIG. 9, comb-like grooves 71b are formed in order to increase a contact area of the injection-molded resin 6 serving as an intermediate conductive layer of heat generated from the IC chip 1. A heat radiating plate 72 shown in FIG. 10 includes lugs 72c for promoting heat radiation from side surfaces 6a of the injection-molded resin 6 shown in FIG. 4.

In addition to the heat radiating plates shown in the above embodiments, the heat radiating plate may be drawn into a corrugated shape as a whole (not shown). In this case, the adhesion strength between the inner surface of the heat radiating plate and the resin can be improved, and the heat radiation property on its outer surface can be improved.

A method of temporarily fixing the heat radiating plate 7 to an upper half 100 is not limited to vacuum suction as in the above embodiment. For example, a recess portion is formed in the upper half 100 so that the heat radiating plate is fitted in the recess portion.

Figure 11:
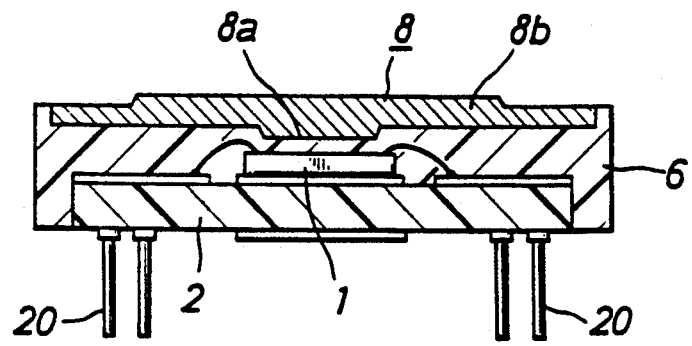
FIG. 11 is a sectional view showing another embodiment of the resin encapsulated PGA according to the present invention.

FIG. 11 shows another embodiment of the resin encapsulated PGA according to the present invention.

In this embodiment, a heat radiating plate 8 having projecting portions is integrally molded as a heat radiating member instead of the metal heat radiating plate 7 of the embodiment shown in FIG. 4.

A lower surface projecting portion 8a is formed on the lower surface of the heat radiating plate 8 in correspondence with a position of an IC chip 1, and an upper projecting portion 8b larger than the lower projecting portion 8a is formed on its upper surface.

In this structure, the lower projecting portion 8a of the heat radiating plate 8 projects inside a wire bonding position of the IC chip 1 to reduce a distance between the heat radiating plate 8 and the IC chip 1. The upper projecting portion 8b is formed to increase a rigidity at a central portion required to prevent warpage produced when an encapsulating resin 6 is finally cured at a high temperature of 175° C.

Therefore, heat generated from the IC chip 1 is conducted to the lower surface projecting portion 8a which is closer to the IC chip 1 and radiated from the upper surface projecting portion 8b having a large heat radiating area.

Figure 12:
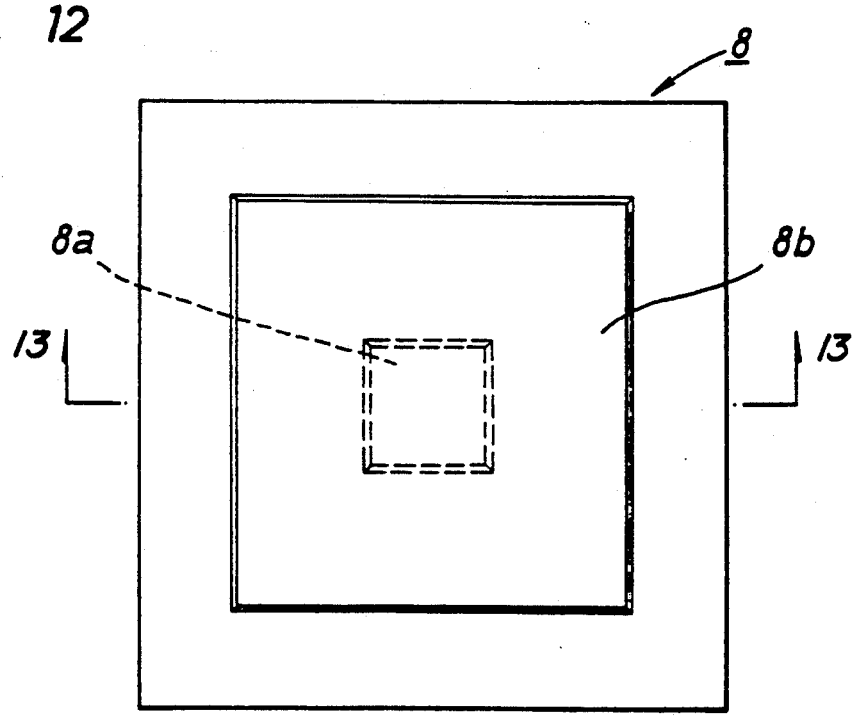
FIG. 12 is a plan view showing a heat radiating plate used in the embodiment shown in FIG. 11.
Figure 13:
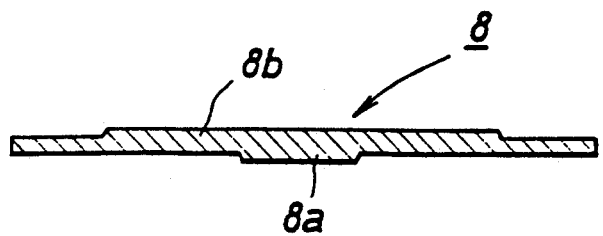
FIG. 13 is a sectional view showing the heat radiating plate taken along the line 13—13 in FIG. 12.

FIG. 12 is a plan view of the heat radiating plate 8 and FIG. 13 is a sectional view taken along the line 13—13 in FIG. 12.

A complicated shape of the heat radiating plate 8 is formed from a 1.4-mm thick aluminum plate by coining and is completed by three steps, i.e., embossing of the lower surface projecting portion 8a, embossing of the upper surface projecting portion 8b, and cutting of an outer shape.

In the heat radiating plate 8 of this embodiment, the thicknesses of the lower surface projecting portion 8a, the upper surface projecting portion 8b, and a base portion are 0.2 mm, 0.4 mm, and 0.8 mm, respectively.

When the resin encapsulated PGA shown in FIG. 11 is compared with the PGA of the embodiment shown in FIG. 4, a distance between the IC chip 1 and the heat radiating plate 8 in the PGA of this embodiment is reduced by the thickness of the lower surface projecting portion 8a. This is advantageous for the heat radiation property in consideration of the fact that the heat conductivity of the encapsulating resin 6 is 0.0084 (W/cm.°C) and that of aluminum constituting the heat radiating plate 8 is 2.04 (W/cm.°C). Actually, a temperature characteristic of 34 (°C/W) is obtained by the PGA of this embodiment, while that of the PGA shown in FIG. 4 is 42 (°C/W). This value substantially equals a temperature characteristic of 33.5 (°C/W) of the ceramic substrate PGA.

Since the lower surface projecting portion 8a is preferably formed as close as possible to the upper surface of the IC chip 1, it has a trapezoidal shape formed inside bonding wires of the IC chip 1.

Figure 14:
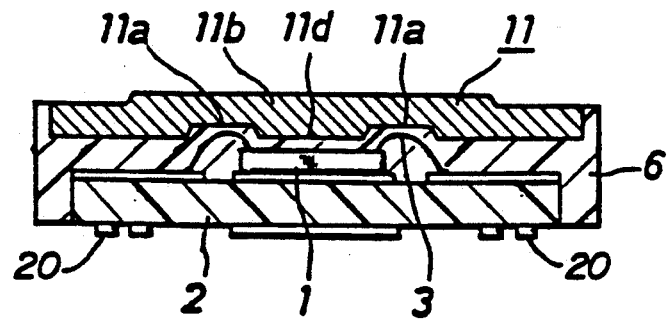
FIG. 14 is a sectional view showing still another embodiment of the resin encapsulated semiconductor device according to the present invention.

FIG. 14 shows one embodiment of the resin encapsulated semiconductor device of according to the present invention.

Similar to the embodiment shown in FIG. 11, this embodiment aims at improving the heat radiation property. In FIG. 14, the same reference numerals as in FIG. 11 denote the same parts but a heat radiating plate is denoted by reference numeral 11, and the numeral 20 now denotes contact terminals rather than contact pins.

A groove-like recess portion 11a for evading a height of wires 3 of wire bonding formed on an IC chip 1 is formed in the lower surface of the heat radiating plate 11, and an upper surface projecting portion 11b is formed on its upper surface.

In this structure, an adhesion of the heat radiating plate 11 is assured by charging an encapsulating resin 6 on a locking step portion 11c. The groove-like recess portion 11a is a square ring formed at a position for evading the height of the wires 3 of the wire bonding formed at four sides of the IC chip 1. As a result, a lower surface projecting portion 11d formed inside the groove-like recess portion 11a projects inside the wire bonding position to reduce a distance to the IC chip 1. The upper surface projecting portion 11b is formed to increase a rigidity at a central portion required for preventing warpage produced when the encapsulating resin 6 is finally cured at a high temperature of 175° C.

Therefore, heat generated from the IC chip 1 is conducted to the lower surface projecting portion 11d which is closer to the IC chip 1 and radiated from the upper surface projecting portion 11b having a large heat radiating area.

Figure 15:
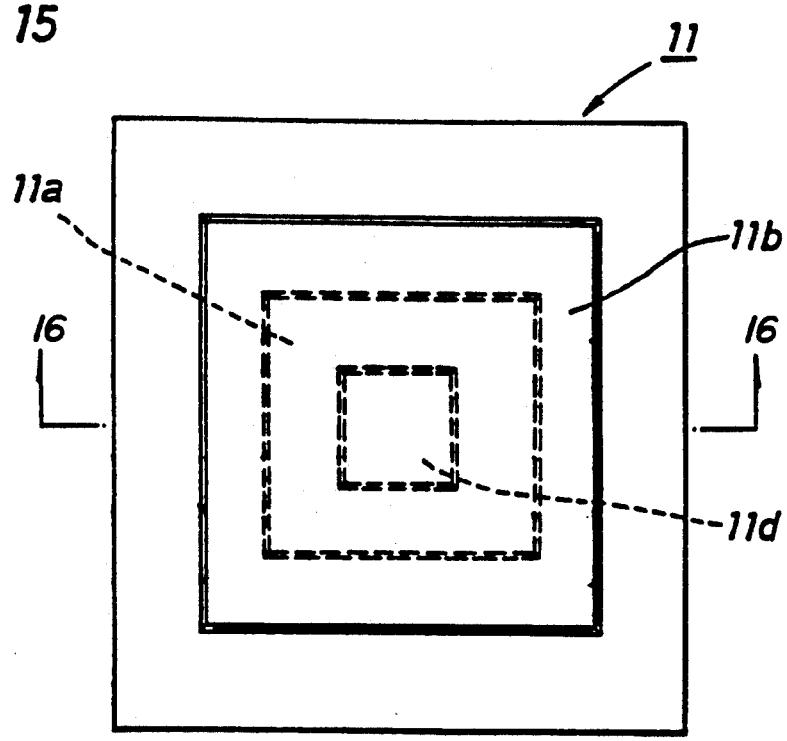
FIG. 15 is a plan view of a heat radiating plate used in the embodiment shown in FIG. 14.
Figure 16:
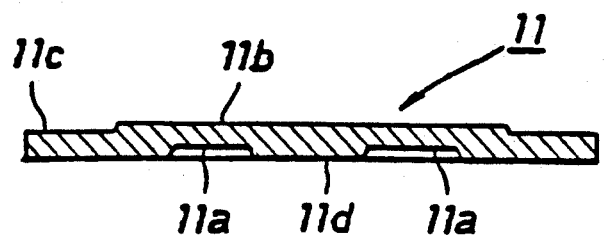
FIG. 16 is a sectional view showing the heat radiating plate taken along the line 16—16 in FIG. 15.

FIG. 15 is a plan view showing the heat radiating plate 11, and FIG. 16 is a sectional view taken along the line 16—16 in FIG. 15.

A complicated shape of the heat radiating plate 11 is formed from a 1.4-mm thick aluminum plate by coining and is completed by three steps, i.e., embossing of the groove-like recess portion 11a, embossing of the upper surface projecting portion 11b, and cutting of an outer shape.

Similar to the PGA of the embodiment shown in FIG. 11, the semiconductor device according to this embodiment can provide a heat radiation property substantially equal to a temperature characteristic of 33.5 (°C/W) of the ceramic substrate PGA.

The shape of the groove-like recess portion 11a is not limited to a square of this embodiment. For example, if the wire bonding is formed at three sides of the IC chip, a U-shaped groove is formed. If the wire bonding is formed at opposing two sides, two parallel grooves are formed.

The heat radiating plate used in the resin encapsulated semiconductor devices and PGA according to the present invention can be formed by various methods such as cutting or pressing a metal plate of, e.g., aluminum. Pressing is economically most advantageous and therefore is adopted in this embodiment.

However, when a pressed heat radiating plate is insert-molded, the following problem is posed in accordance with a combination of conditions. That is, in order to manufacture a heat radiating plate by pressing, a metal plate is formed to have projections by coining and is completed by outer shape punching. Therefore, a shear drop portion and an edge portion are formed on the upper and lower surfaces of the completed heat radiating plate, respectively, in accordance with a positional relationship between a dice and a punch.

Figure 17:
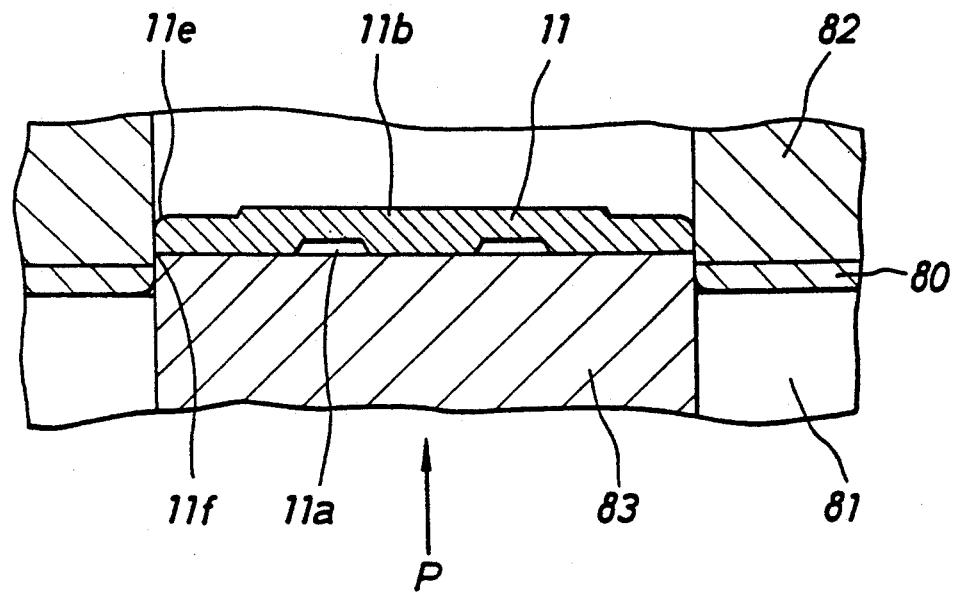
FIG. 17 is a sectional view for explaining a method of punching a heat radiating plate.
Figure 18:
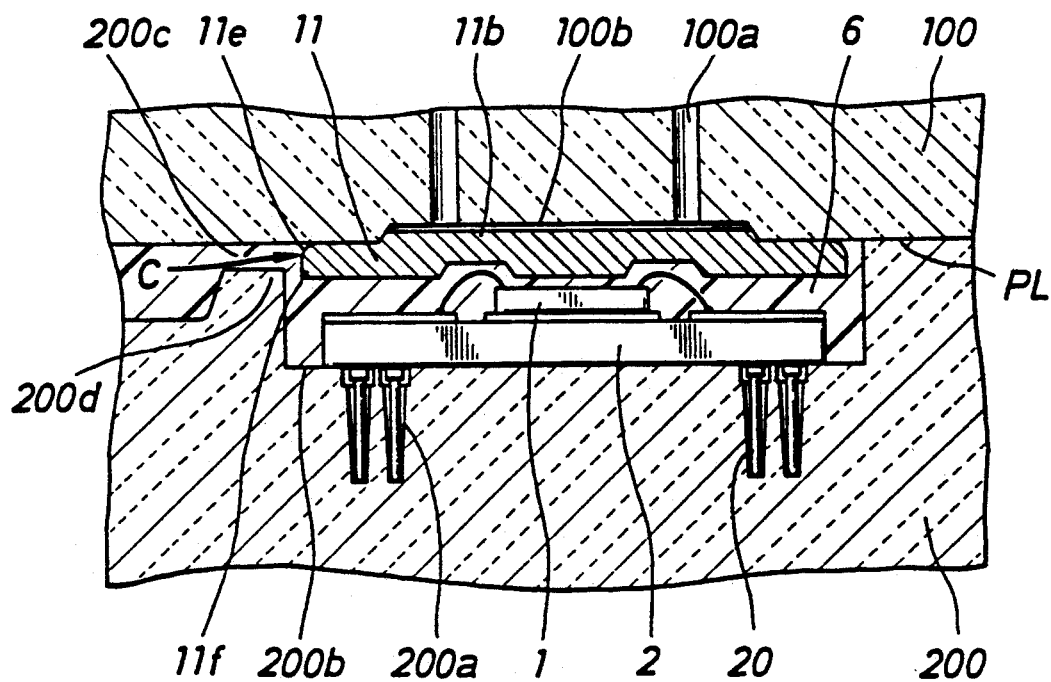
FIG. 18 is a sectional view for explaining a method of manufacturing a resin encapsulated PGA using the heat radiating plate formed by punching shown in FIG. 17.
Figure 19:
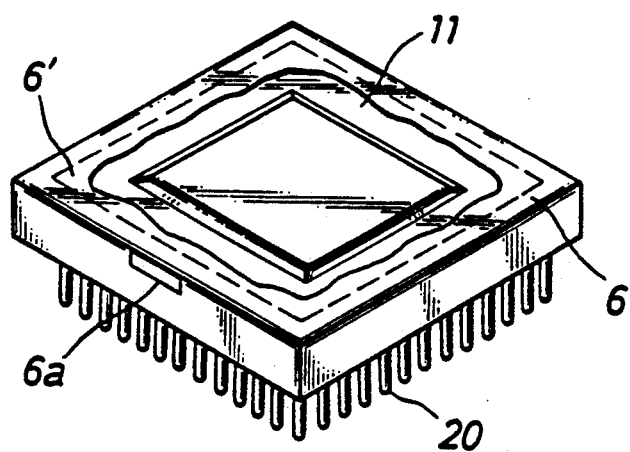
FIG. 19 is a perspective view showing the resin encapsulated PGA manufactured by the method shown in FIG. 18.

FIG. 17 is a sectional view showing a main part of a punching tool for explaining outer shape punching of the heat radiating plate before it is improved, FIG. 18 is a sectional view showing a main part of the mold of a PGA in which the heat radiating plate shown in FIG. 17 is insert-molded, and FIG. 19 is a perspective view showing the PGA manufactured by the method shown in FIG. 18.

FIG. 17 is a view for explaining outer shape punching of a heat radiating plate 11 from an aluminum plate 80 using a punching tool including a punch and a dice known to those skilled in the art. The aluminum plate 80 having a groove-like recess portion 11a on its lower surface and a projecting portion 11b for enlarging a heat radiating area on its upper surface as will be described later is placed on a stripper 81 of the punching tool such that the projecting portion 11b faces up, and a dice 82 is set thereon. Then, a punch 83 is pushed upward in a direction of arrow P to punch an outer shape of the heat radiating plate 11.

As is well known, when output shape punching is performed using the punching tool shown in FIG. 17, a shear drop 11e is formed at a corner portion of the upper surface of the heat radiating plate 11 with respect to a pushing direction of the punch 83, and an edge 11f is formed at a corner portion of its lower surface.

That is, in the heat radiating plate 11, the shear drop (refered to as a rounded corner hereinafter) 11e is formed at the corner portion of the upper surface of the projecting portion 11b, and the edge 11f is formed at the corner portion of the lower surface having the groove-like recess 11a.

FIG. 18 is a sectional view showing a main part of the mold for explaining a molding state of the PGA in which the heat radiating plate 11 is insert-molded. A positioning recess portion 100b and vacuum holes 100a are formed in an upper half 100, and the heat radiating plate 11 is positioned and held by a suction force of the vacuum holes 100a.

A substrate holding portion comprising a recess portion 200b and relief holes 200a for contact pins is formed in a lower half 200. A resin substrate 2 having a plurality of contact pins 20 on its lower surface and an IC chip 1 on its upper surface is positioned and held on the recess portion 200b.

A gate 200c for supplying the molded resin 6 is formed by a projecting portion 200d formed in the lower half 200 at a position of a parting line (PL) at which the upper and lower halves 100 and 200 are brought into contact with each other.

The gate 200c is conventionally formed at the position of the parting line (PL) in order to simplify the structure of the metal molds to reduce a manufacturing cost and to improve the durability.

That is, in the conventional mold as shown in FIG. 6, a complicated recess portion for housing a substrate or the like is cut in the lower half 200, and no complicated cutting is performed in the upper half 100. The gate 200c is defined by the projecting portion 200d formed by cutting in the lower half 200 and the lower surface of the upper half 100. Such a side gate arrangement is the simplest structure.

In this state, by supplying the molded resin 6 from the gate 200c, a resin encapsulated PGA having a gate remaining portion 6a at an upper portion of the molded resin 6 as shown in FIG. 19 is completed.

That is, in the PGA before improvement shown in FIG. 18, in order to prevent burrs produced at the edge 11f of the heat radiating plate 11 from being exposed on the upper surface of the PGA, the heat radiating plate 11 having the rounded corner 11e at the projecting portion 11b side is insert-molded. In this structure, however, the molded resin 6 supplied from the gate 200c under pressure flows between the rounded corner 11e formed at the upper surface corner portion of the heat radiating plate 11 and the upper half 100. As a result, the molded resin 6 flows onto the upper surface of the heat radiating plate 11 to form an island-like pattern 6' as shown in FIG. 19.

When the molded resin 6 is supplied from the gate 200c of the mold shown in FIG. 18, an injection pressure of the molded resin 6 is applied on the side surface of the heat radiating plate 11 as indicated by an arrow C. As a result, the heat radiating plate 11 is deviated from its normal position and molded while it is kept displaced.

The positional deviation of the heat radiating plate 11 is produced because the injection pressure of the molded resin 6 is larger than a holding force applied on the heat radiating plate 11 by a Suction force of the vacuum holes 100b.

Therefore, in order to prevent the positional deviation of the heat radiating plate 11, a knock pin may be formed in the lower half 200 to firmly hold the heat radiating plate against the upper half 100. However, if the knock pin is formed, a structure of the mold is complicated, and a trace of the knock pin remains on a molded product. As a result, outer appearance quality and reliability are degraded.

An embodiment which solves the above problem will be described below.

Figure 20:
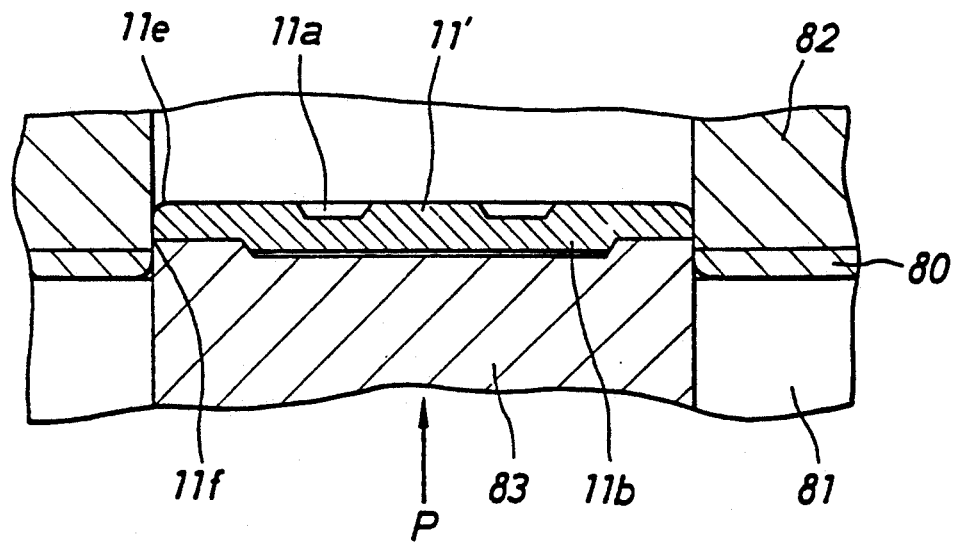
FIG. 20 is a sectional view for explaining another method of punching the heat radiating plate.
Figure 21:
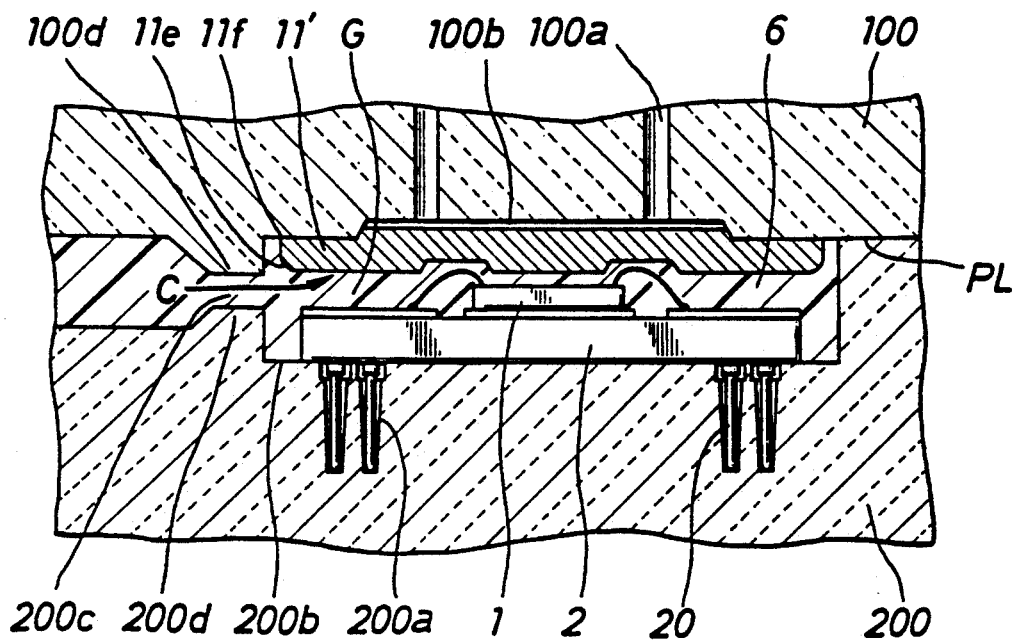
FIG. 21 is a sectional view for explaining another method of manufacturing a resin encapsulated PGA using the heat radiating plate formed by punching shown in FIG. 20.
Figure 22:
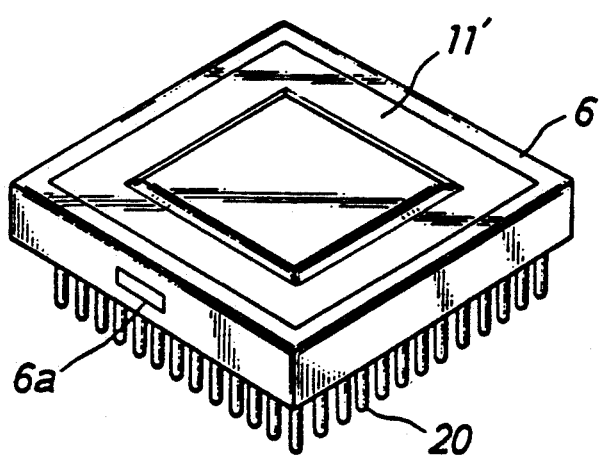
FIG. 22 is a perspective view showing the resin encapsulated PGA according to the present invention manufactured by the method shown in FIG. 21.

FIG. 20 is a sectional view showing a main part of a punching tool for explaining outer shape punching of the head radiating plate of the present invention, FIG. 21 is a sectional view showing the mold of a PGA in which the heat radiating plate of the present invention is insert-molded, and FIG. 22 is a perspective view showing the PGA of the present invention.

A difference between the structures shown in FIGS. 20 and 17 is that in FIG. 20 an aluminum plate 80 is placed on a stripper 81 of a punching tool such that a groove-like recess portion 11a faces up and a dice 82 is set thereon. Then, a punch 83 is pushed upward in a direction indicated by an arrow P to perform outer shape punching of a heat radiating plate 111. That is, contrary to the heat radiating plate 11 shown in FIG. 7, an edge 11f is formed at a corner portion of the upper surface on which a projecting portion 11b is formed, and a shear drop that is a rounded corner 11e is formed at a corner portion of the lower surface on which a groove-like recess portion is formed.

A difference between the structures shown in FIGS. 21 and 18 is that in FIG. 21 a heat radiating plate 11' is positioned and held in a positioning recess portion 100a of an upper half 100 such that the rounded corner produced by outer shape punching faces inward, and that a height of a projecting portion 200d of a lower half 200 is reduced and a projecting portion 100d is formed in an upper half 100 in correspondence to the projecting portion 200d.

The heights of the projecting portions 100d and 200d are suitably set to form a gate 200c at a position of a gap portion G defined by the heat radiating plate 11 held by the upper half 100 and a resin substrate 2 held by the lower half 200.

As a result, since the inner surface of the upper half 100 is in tight contact with the edge 11f at the upper surface corner portion of the heat radiating plate 11', the molding resin 6 does not flow onto the upper surface of the heat radiating plate 11'.

In this embodiment, the position of the gate 200c of the mold is moved downward so that a flow of the molding resin 6 is moved away from the upper surface corner portion of the heat radiating plate 11'. Therefore, the molding resin 6 does not flow onto the upper surface of the heat radiating plate 11'. In addition, since an injection pressure of the molding resin 6 supplied from the gate 200c is applied on the lower surface of the heat radiating plate 11', the heat radiating plate 11' is strongly held by the heat radiating plate holding portion of the upper half 200, thereby preventing positional deviation of the heat radiating plate 11'.

Therefore, as shown in FIG. 22, a PGA in which the heat radiating plate 11' is correctly insert-molded is completed, and a gate remaining portion 6a is formed in a middle portion of the molding resin 6.

The PGA shown in FIG. 22 has no island-like pattern 6' on the heat radiating plate 11' unlike in the PGA shown in FIG. 19. In addition, the gate remaining portion 6a is formed in the middle portion of the molding resin 6.

Referring to FIGS. 23A to 23G, manufacturing steps of the heat radiating plate 11' shown in FIG. 20 will be described.

In a blanking step shown in FIG. 23A, an aluminum plate 80 is formed into a blank having a larger outer diameter than that of the heat radiating plate 11' and its all surfaces are roughened. In a coining step shown in FIG. 23B, a groove-like recess portion 11a and a projecting portion 11b are formed by coining. In an anodized aluminum coating step shown in FIG. 23C, all the surfaces of the aluminum plate 80 are oxidized to form an anodized aluminum layer 80a thereon.

In a resist coating step shown in FIG. 23D, a resist film 80b is formed on the u per and side surfaces.

In an anodized aluminum removing step shown in FIG. 23E, the anodized aluminum layer 80a on the lower surface on which no resist film 80b is formed is removed using a removing solution.

In a resist removing step shown in FIG. 23F, the resist film 80b is removed using a removing solution.

Finally, in an outer shape punching step shown in FIG. 23G, a portion indicated by an alternate long and two dashed line is punched to complete the heat radiating plate 11'. Outer shape punching shown in FIG. 23G is performed using the punching tool shown in FIG. 20, thereby forming a shear drop 11e at a corner portion of the lower surface.

The upper surface of the radiating plate 11' formed in accordance with the above manufacturing steps is coated with the beautiful black anodized aluminum layer 80a, and the roughened surface of the aluminum plate 80 is exposed on its lower surface.

Therefore, when the heat radiating plate 11' is insert-molded as shown in FIG. 21, the roughened lower surface of the heat radiating plate 11' is brought into contact with the molded resin 6 to increase the reliability. In addition, since the exposed upper surface has a beautiful black color, outer appearance quality as a product is improved.

Figure 24:
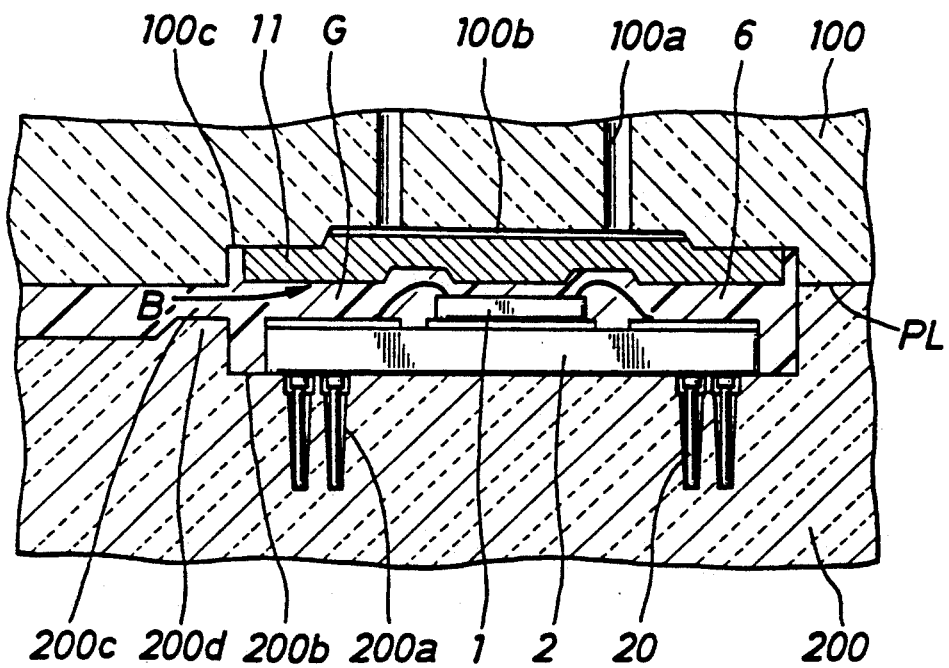
FIG. 24 is a sectional view showing another embodiment of the metal molds for molding the PGA used in the method according to the present invention.

FIG. 24 shows another embodiment of a mold for molding the resin encapsulated PGA according to the present invention. A difference between the embodiments shown in FIGS. 24 and 21 is that in FIG. 24 a recess portion 100c for housing a heat radiating plate 11 is formed in an upper half 100 to move a position of a parting line (PL) downward and a gate 200c is defined by the lower surface of the upper half 100 and a projecting portion 200d formed in a lower half 200.

With the above arrangement, since the gate 200c is formed at a position of a gap G as in the embodiment shown in FIG. 21, an injection pressure of a molding resin 6 effectively, strongly holds the heat radiating plate against a heat radiating plate holding portion of the upper half 100 as indicated by arrow B.

What is claimed is:

1. A resin encapsulated semiconductor device in which an IC chip having an upper surface is mounted on a resin substrate having a plurality of contact terminals on a lower surface thereof, comprising a metal heat radiating member embedded in an encapsulating resin with an upper surface thereof facing away from the IC chip being exposed to the outside and with a lower surface facing toward the IC chip being substantially parallel to and in non-contact with the IC chip to provide a gap between said lower surface and the IC chip completely filled with said resin, the lower surface of said metal heat radiating member having a projecting portion at a position corresponding to said IC chip to provide a smaller gap between the lower surface of the metal heat radiating member and the IC chip, whereby heat of the IC chip is transferred to said metal heat radiating member through the encapsulating resin in the gap.

2. A resin encapsulated semiconductor device in which an IC chip having an upper surface is mounted on a resin substrate having a plurality of contact terminals on a lower surface thereof, comprising a metal heat radiating member embedded in an encapsulating resin with an upper surface thereof facing away from the IC chip being exposed to the outside and with a lower surface facing toward the IC chip being substantially parallel to and in non-contact with the IC chip to provide a gap between said lower surface and the IC chip completely filled with said resin, the lower surface of said metal heat radiating member having a projecting portion at a position corresponding to said IC chip to provide a smaller gap between the lower surface of the metal heat radiating member and the IC chip, the projecting portion being closer to the IC chip than a portion of the lower surface of the metal heat radiating member at a position corresponding to wires of wire bonding formed on the IC chip, whereby heat of the IC chip is transferred to said metal heat radiating member through the encapsulating resin in the gap.

3. A resin encapsulated semiconductor device in which an IC chip having an upper surface is mounted on a resin substrate having a plurality of contact terminals on a lower surface thereof, comprising a metal heat radiating member embedded in an encapsulating resin with an upper surface thereof facing away from the IC chip being exposed to the outside and with a lower surface facing toward the IC chip being substantially parallel to and in non-contact with the IC chip to provide a gap between said lower surface and the IC chip completely filled with said resin only, the lower surface of said metal heat radiating member having a projecting portion at a position corresponding to said IC chip to provide a smaller gap between the lower surface of the metal heat radiating member and the IC chip, the projecting portion being closer to the IC chip than a remainder of the lower surface of the metal heat radiating member at a position corresponding to wires of wire bonding formed on the IC chip, whereby heat of the IC chip is transferred to said metal heat radiating member through the encapsulating resin in the gap.

4. A resin encapsulating semiconductor device in which an IC chip having an upper surface is mounted on a resin substrate having a plurality of contact terminals on a lower surface thereof, comprising a metal heat radiating member embedded in an encapsulating resin with an upper surface thereof facing away from the IC chip being exposed to the outside and with a lower surface facing toward the IC chip being substantially parallel to and in non-contact with the IC chip to provide a gap between said lower surface and the IC chip completely filled with said resin only, the lower surface of said metal heat radiating member having a groove-like recess for evading wires of wire-bonding formed on the IC chip, whereby heat of the IC chip is transferred to said metal heat radiating member through the encapsulating resin in the gap.

5. A resin encapsulated semiconductor device in which an IC chip having an upper surface is mounted on a resin substrate having a plurality of contact terminals on a lower surface thereof, comprising a metal heat radiating member embedded in an encapsulating resin with an upper surface thereof facing away from the IC chip being exposed to the outside and with a lower surface facing toward the IC chip being substantially parallel to and in non-contact with the IC chip to provide a gap between said lower surface and the IC chip completely filled with said resin, the lower surface of said metal heat radiating member having a groove-like recess which is spaced from the IC chip a distance greater than said gap for evading wires of wire-bonding formed on the IC chip, whereby heat of the IC chip is transferred to said metal heat radiating member through the encapsulating resin in the gap.

* * * * *